(12) United States Patent
Miyamae et al.

(10) Patent No.: US 7,160,035 B2
(45) Date of Patent: Jan. 9, 2007

(54) OPTICAL MODULE, METHOD OF MANUFACTURING THE SAME, OPTICAL COMMUNICATION DEVICE AND ELECTRONIC DEVICE USING THE SAME

(75) Inventors: Akira Miyamae, Fujimi-machi (JP); Kimio Nagasaka, Nirasaki (JP)

(73) Assignee: Seiko Epson Corporation, Tokyo (JP)

( * ) Notice: Subject to any disclaimer, the term of this patent is extended or adjusted under 35 U.S.C. 154(b) by 98 days.

(21) Appl. No.: 10/844,418

(22) Filed: May 13, 2004

(65) Prior Publication Data
US 2005/0002618 A1  Jan. 6, 2005

(30) Foreign Application Priority Data
May 27, 2003 (JP) ............................. 2003-149860

(51) Int. Cl.
*G02B 6/36* (2006.01)
(52) U.S. Cl. ............................. 385/88; 385/89; 385/91
(58) Field of Classification Search ............ 385/88–89
See application file for complete search history.

(56) References Cited

U.S. PATENT DOCUMENTS

| 4,144,555 | A | * | 3/1979 | McGalliard ................. 361/715 |
| 4,678,264 | A | * | 7/1987 | Bowen et al. ................. 385/89 |
| 4,707,067 | A | * | 11/1987 | Haberland et al. ............. 385/90 |
| 4,824,511 | A | * | 4/1989 | Hartman et al. ........... 156/306.6 |
| 5,539,767 | A | | 7/1996 | Nakanishi et al. |
| 5,768,456 | A | | 6/1998 | Knapp et al. |
| 5,815,616 | A | | 9/1998 | Bishop et al. |
| 6,285,808 | B1 | * | 9/2001 | Mehlhorn et al. ............. 385/14 |
| 6,421,474 | B1 | * | 7/2002 | Jewell et al. ................. 385/14 |
| 6,483,960 | B1 | * | 11/2002 | Schroedinger ................ 385/14 |
| 2002/0118924 | A1 | | 8/2002 | Murata |
| 2003/0002179 | A1 | | 1/2003 | Roberts et al. |
| 2004/0142539 | A1 | * | 7/2004 | Koizumi ..................... 438/455 |
| 2004/0264883 | A1 | * | 12/2004 | Althaus et al. ............... 385/88 |
| 2005/0139946 | A1 | * | 6/2005 | Hung et al. ................. 257/433 |
| 2005/0205201 | A1 | * | 9/2005 | Kim et al. ................... 156/257 |
| 2005/0249450 | A1 | * | 11/2005 | Schodinger .................. 385/14 |
| 2006/0018606 | A1 | * | 1/2006 | Ishizaka ..................... 385/88 |
| 2006/0104562 | A1 | * | 5/2006 | Rosch et al. ................. 385/14 |

FOREIGN PATENT DOCUMENTS

| JP | A-11-287926 | 10/1999 |
| JP | A-2000-349307 | 12/2000 |
| WO | WO 02/27874 A2 | 4/2002 |
| WO | WO 02/054129 A1 | 7/2002 |

OTHER PUBLICATIONS

U.S. Appl. No. 10/730,105, filed Dec. 9, 2003, Miyamae et al.
U.S. Appl. No. 10/792,894, filed Mar. 5, 2004, Miyamae et al.

* cited by examiner

*Primary Examiner*—Ellen E. Kim
(74) *Attorney, Agent, or Firm*—Oliff & Berridge, PLC

(57) ABSTRACT

The invention provides an optical module that can reduce its cost. An optical module to which an optical fiber is detachably inserted, includes: a substrate with an aperture to which the optical fiber is inserted; a flexible printed circuit board disposed on one surface of the substrate and including: a base member with an opening in a corresponding location to the aperture; an interconnection layer disposed on at least one surface of the base member); and a connection section including a part of the interconnection layer exposed through the opening; and an optical element disposed within the opening of the flexible printed circuit board, and connected to the connection section, the optical element performing one of transmission and reception of an optical signal with the optical fiber.

15 Claims, 6 Drawing Sheets

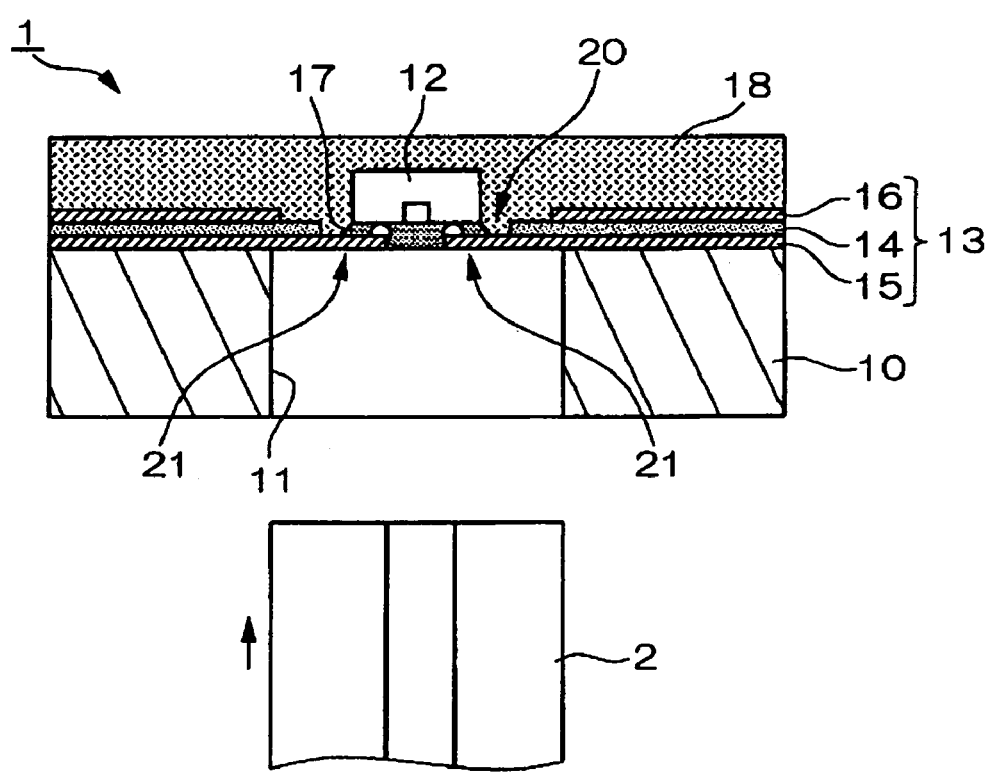

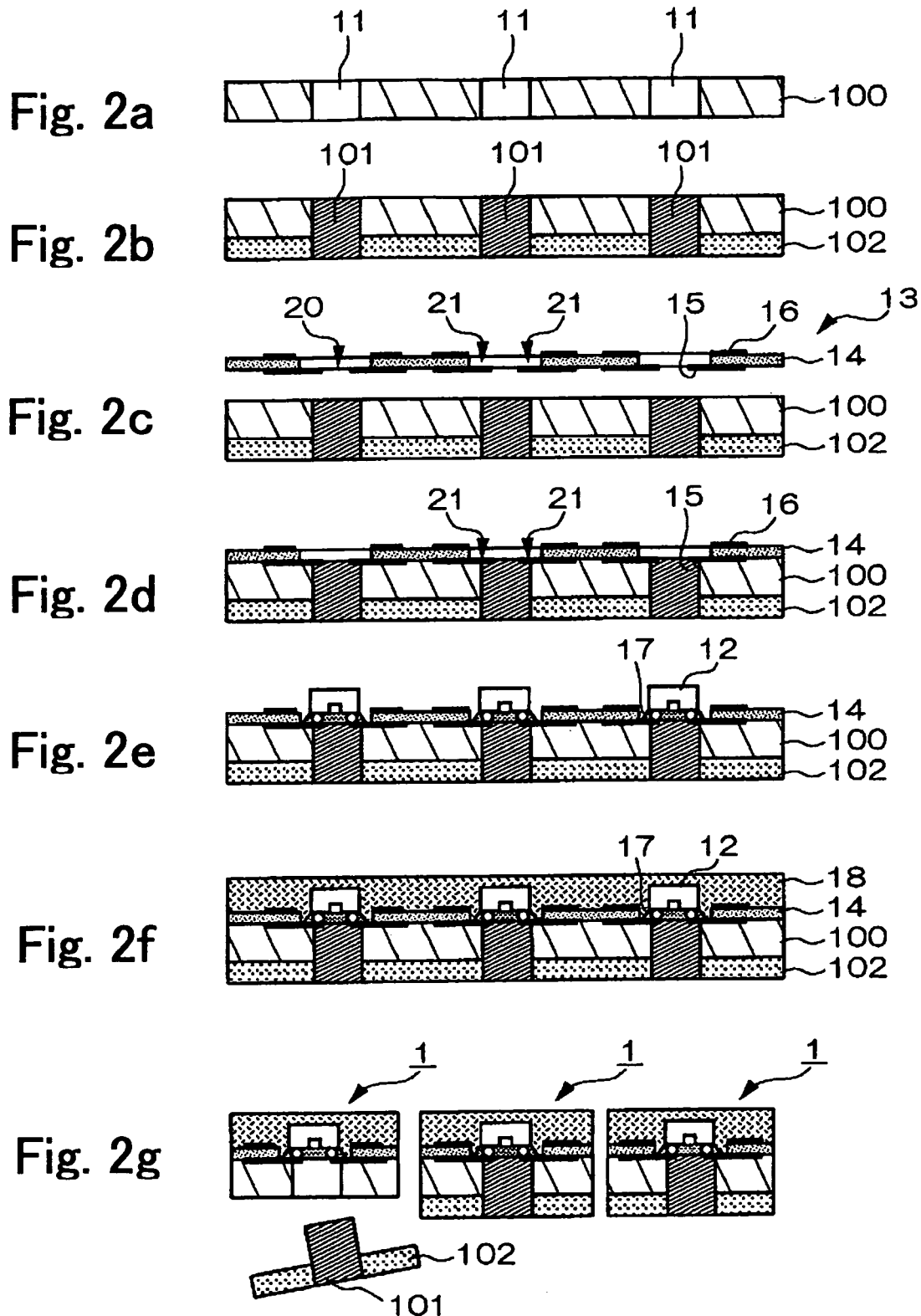

OPTICAL MODULE, METHOD OF MANUFACTURING THE SAME, OPTICAL COMMUNICATION DEVICE AND ELECTRONIC DEVICE USING THE SAME

BACKGROUND OF THE INVENTION

1. Field of Invention

The present invention relates to an optical module suitable for application to optical communication systems, and to a manufacturing method of the optical module.

2. Description of Related Art

Related art optical communication systems have basic configurations, in which light emitting elements to convert an electrical signal to an optical signal and light receiving elements to convert an optical signal to an electrical signal, are connected through optical fibers. In order to detachably connect such optical elements as light emitting elements or light receiving elements with optical fibers, optical modules to optically connect optical elements to optical fibers are used. Such optical modules are described in various documents, such as Japanese laid-open patent publication No. 2000-349307, for example.

SUMMARY OF THE INVENTION

Since the optical modules mentioned above have structures in which substrates are interposed between the optical elements and the optical fibers, a gap of at least the thickness of the substrates must be present between the optical elements and the optical fibers. Therefore, light coupling losses between the optical elements and the optical fibers easily occur and high accuracy is required for the alignment thereof. Further, interconnection layers to transfer signals to or from the optical elements are provided by patterning conductive films formed on the substrates, which increases manufacturing cost, because it is not very easy to pattern the conductive material on such a three-dimensional shape.

Consequently, the present invention provides an optical module capable of increasing light coupling efficiency.

Further, the present invention provides an optical module capable of reducing the manufacturing cost.

In order to address or achieve the above, an optical module according to a first aspect of the present invention is detachably connectable to an optical fiber, that includes: a substrate, a flexible printed circuit board, and an optical element. The substrate is provided with an aperture in which the optical fiber is inserted. The flexible printed circuit board is disposed on one surface of the substrate and includes a base member with an opening in a corresponding location to the aperture, an interconnection layer disposed on at least one surface of the base member, and a connection section including a part of the interconnection layer exposed through the opening. The optical element is disposed within the opening of the flexible printed circuit board and connects to the connection section and performs one of transmission and reception of an optical signal with the optical fiber.

Since the flexible printed circuit board having the interconnection layer is used, patterning of the interconnection layer on the substrate can be omitted, thus reducing the manufacturing cost and accordingly reducing total cost of the optical module. Further, since the optical element is disposed on the connecting section (so called "flying leads") exposed through the opening provided to the flexible printed circuit board, the distance between the optical element and the optical fiber can be reduced, thus enhancing the light coupling efficiency. It is advantageous that the alignment margin is expanded due to the increased light coupling efficiency.

It is also preferable to further include an alignment member (an underfill member) interposed between an area defined by the aperture and the optical element and to reduce or suppress dispersion of the optical signal. Thus, the interface reflection is reduced or suppressed to further enhance the light coupling efficiency.

It is also preferable to include a seal member to tightly seal the optical element. Thus, the optical element can be more tightly sealed and accordingly more securely protected.

It is also preferable that the seal member and the alignment member be made of the same material. Thus, adhesion of the seal member to the alignment member can be enhanced. Moreover, the manufacturing process can be simplified by forming the alignment member and the sealing member in the same process step.

It is also preferable to use the flexible printed circuit board that includes a microstrip line. Thus, a transfer loss in higher frequency band can be reduced to provide an optical module suitable for high-speed drive of the optical element.

It is also preferable to provide on the flexible printed circuit board an electronic component to form an electronic circuit with the optical element. Here, "an electronic component" denotes, for example, a driver to drive a light emitting element as the optical element, an amplifier to amplify an output signal of a light receiving element as the optical element, other various circuit chips, or passive components, such as a resistor or capacitor, or other various active components or passive components, etc. By providing various electronic components involved in the operation of the optical element, it is possible to eliminate or simplify an external drive circuit or the like. Further, since the length of an interconnection between the optical element and a circuit chip, such as a driver, can be shortened, it is expected that problems such as delays in signals and interfusion of noises can easily be reduced or avoided.

An optical module according to a second aspect of the present invention includes: a substrate, a flexible printed circuit board, and an optical element. The substrate is provided with an aperture in which a component is disposed. The flexible printed circuit board is disposed on one surface of the substrate and includes a base member with an opening in a corresponding location to the aperture, an interconnection layer disposed on at least one surface of the base member, and a connection section including a part of the interconnection layer exposed through the opening. The optical element is disposed inside the aperture and within the opening of the flexible printed circuit board and connects to the connection section and performs one of transmission and reception of an optical signal through the flexible printed circuit board.

By this configuration, it is also possible to reduce the manufacturing cost and accordingly to reduce total cost of the optical module. Further, the distance between the optical element and the optical fiber can be reduced, thus enhancing the light coupling efficiency. Still further, by taking the structure in which the optical element is disposed in the space provided by the aperture for disposition of the component and is supported by the flexible printed circuit board disposed so as to cover the aperture, it is possible to achieve further downsizing of the optical module.

The optical module according to the second aspect is also preferably equipped with a light guide on the other surface (opposite to the substrate) of the flexible printed circuit board to transmit or receive the optical signal to or from the optical element. Here, "a light guide" has no limitation to its structure as long as it can transfer the light signal in a required direction, and as examples, a member having a core/clad structure using two media having different refractive index from each other like an optical fiber, or a member utilizing a photonic crystal can be used. Further, the light guide (a planar type light guide) to be disposed so that an extension direction thereof is substantially parallel to one direction of the substrate is preferably adopted.

The further preferable conditions for the optical module according to the second aspect are basically the same as those for the optical module according to the first aspect. Although the further detailed description is omitted here, substantially the same conditions regarding the alignment member, the sealing member, the electronic components, etc., can be adopted thereto.

An optical module according to a third aspect of the present invention includes: a substrate having translucency, a flexible printed circuit board, and an optical element. The flexible printed circuit board disposed on one surface of the substrate and includes a base member with an opening, an interconnection layer disposed on at least one surface of the base member, and a connection section comprising a part of the interconnection layer exposed through the opening. The optical element disposed within the opening of the flexible printed circuit board and connects to the connection section and performs one of transmission and reception of an optical signal through the flexible printed circuit board and the substrate.

By this configuration, it is also possible to reduce the manufacturing cost and accordingly to reduce total cost of the optical module. Further, the distance between the optical element and the optical fiber can be reduced, thus enhancing the light coupling efficiency.

The optical module according to the third aspect as described above is preferably equipped with a light guide on the other surface of the transparent substrate that transmits or receives the optical signal to or from the optical element. Further, a sleeve or other device to support the optical fiber is preferably provided. The further preferable conditions for the optical module according to the third aspect is also basically the same as those for the optical module according to the first aspect. Although the further detailed description is omitted here, substantially the same conditions regarding the alignment member, the sealing member, the electronic components, etc., can be adopted thereto.

Furthermore, the present invention also relates to an optical communication device (an optical transceiver) equipped with the optical module mentioned above. Such an optical communication device according to the present invention can be applied to various electronic devices that communicate information with external devices, etc., using light as a transmission medium, such as personal computers or so-called PDAs (portable information terminal devices), for example. In the present specification "an optical communication device" denotes not only a device including both of a configuration regarding transmission of an optical signal (a light emitting element or the like) and a configuration regarding reception of an optical signal (a light receiving element or the like), but also a device equipped only with the configuration regarding transmission (so-called "optical transmission module") and a device only equipped with the configuration regarding reception (so-called "optical reception module").

The present invention also relates to an electronic device equipped with the optical module mentioned above. In further detail, not only an electronic device equipped with the optical module itself as mentioned above, but also an electronic device equipped with the optical communication device including the optical module as mentioned above, is also included in the scope and spirit of the electronic device according to the present invention. In the present specification, the term "an electronic device" is used to denote a device in general that realizes a certain function using an electronic circuit or the like without any particular limitations in its configuration. For example, personal computers, PDAs (portable information terminal devices), or personal digital assistants can be used as the electronic devices, for example.

Another aspect of the present invention is a method of manufacturing an optical module to detachably connect to an optical fiber, including: boring an aperture in a substrate in which the optical fiber is inserted, mounting a flexible printed circuit board on one side of the substrate, the flexible printed circuit board including a base member with an opening, an interconnection layer disposed on at least one surface of the base member, and a connection section including a part of the interconnection layer exposed through the opening, so that the opening corresponds to the aperture, and disposing an optical element in the opening of the flexible printed circuit board to be connected to the connection section, the optical element performing one of transmission and reception of an optical signal with the optical fiber.

By the present manufacturing method, the optical module according to the first aspect of the present invention as described above can be manufactured. A flexible printed circuit board including a microstrip line can also be used.

Furthermore, it is possible to form a large number of the optical modules at substantially the same time by performing in parallel the manufacturing method described above at a large number of portions on the substrate. More specifically, a manufacturing method according to still another aspect of the present invention is a method of manufacturing an optical module to detachably connect to an optical fiber, including: boring a plurality of apertures in a substrate, the optical fiber being inserted in each of the apertures, mounting a flexible printed circuit board on one side of the substrate, the flexible printed circuit board including a base member with a plurality of openings, an interconnection layer disposed on at least one surface of the base member, and connection sections, each including a part of the interconnection layer exposed through one of the openings, so that each of the openings corresponds to respective one of the apertures, disposing an optical element in each of the opening of the flexible printed circuit board to be connected to one of the connection sections, the optical element performing one of transmission and reception of an optical signal with the optical fiber, and dividing the substrate into predetermined areas, each corresponding to respective one of the apertures.

By the present manufacturing method, the optical module according to the first aspect of the present invention as described above can be manufactured. Furthermore, since almost all fabrication processes of the optical modules can be batch-processed on one substrate, a large amount of cost effective optical modules can be manufactured with high yield ratio.

It is also preferable for the method to further include forming an alignment member between an area defined by the aperture and the optical element, the alignment member reducing or suppressing dispersion of the optical signal.

It is also preferable for the method to further include forming a sealing member so that the sealing member covers the optical element.

It is also preferable for the method to further include forming electronic components corresponding to respective optical elements on the flexible printed circuit board, each of the electronic components forming an electronic circuit with the corresponding one of the optical elements.

Furthermore, a manufacturing method according to still another aspect of the present invention includes: boring an aperture in a substrate in which a component is disposed, mounting a flexible printed circuit board on one side of the substrate, the flexible printed circuit board including a base member with an opening, an interconnection layer disposed on at least one surface of the base member, and a connection section including a part of the interconnection layer exposed through the opening, so that the opening corresponds to the aperture, and disposing an optical element inside the aperture and in the opening of the flexible printed circuit board to be connected to the connection section thereof so that one of a light emission surface and a light reception surface thereof faces the flexible printed circuit board, the optical element performing one of transmission and reception of an optical signal.

By this manufacturing method, the optical module according to the second aspect of the present invention can be manufactured. A flexible printed circuit board including a microstrip line can also be used. Furthermore, it is possible to form a large number of the optical modules at substantially the same time by performing in parallel the manufacturing method described above at a large number of portions on the substrate followed by dividing into pieces. It is further preferable for the method to include forming the alignment member, the sealing member, or electronic components. Details of these processes is as described above.

Furthermore, a manufacturing method according to still another aspect of the present invention includes: providing a substrate having translucency, mounting a flexible printed circuit board on one side of the substrate, the flexible printed circuit board comprising a base member with an opening, an interconnection layer disposed on at least one surface of the base member, and a connection section including a part of the interconnection layer exposed through the opening, and disposing an optical element in the opening of the flexible printed circuit board to be connected to the connection section thereof so that one of a light emission surface and a light reception surface thereof faces the flexible printed circuit board, the optical element performing one of transmission and reception of an optical signal.

By this manufacturing method, the optical module according to the third aspect of the present invention can be manufactured. The flexible printed circuit board including a microstrip line can also be used. Furthermore, it is possible to form a large number of the optical modules at substantially the same time by performing in parallel the manufacturing method described above at a large number of portions on the substrate followed by dividing into pieces. It is further preferable for the method to include forming the alignment member, the sealing member, or electronic components. Details of these processes is as described above.

BRIEF DESCRIPTION OF THE DRAWINGS

FIG. 1 is a schematic explaining a structure of an optical module according to a first exemplary embodiment;

FIGS. 2a–2g are schematics explaining a manufacturing method of an optical module according to a first exemplary embodiment;

DETAILED DESCRIPTION OF PREFERRED EMBODIMENTS

Figure 3A:
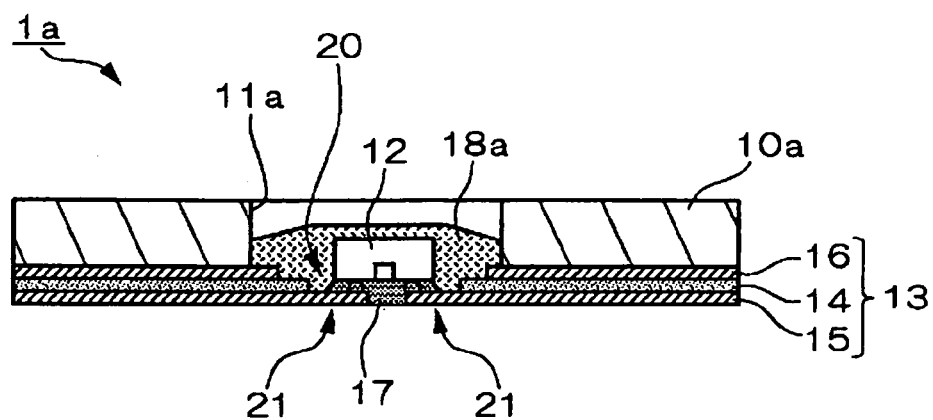
FIGS. 3a and 3b are schematics explaining a structure of an optical module according to a second exemplary embodiment.

Exemplary embodiments of the present invention are described below with referring to the accompanying drawings.

(First Exemplary Embodiment)

FIG. 1 is a schematic r explaining a structure of an optical module according to a first exemplary embodiment of the present invention. A cross-sectional view of the optical module according to the present embodiment is shown in the figure. An optical module 1 shown in FIG. 1 includes a substrate 10, an optical element 12, a flexible printed circuit board 13, an underfill member 17, and a sealing member 18. The optical module 1 is configured, as shown in the figure, so that an optical fiber 2 is detachably inserted in an aperture 11 provided in the substrate 10.

The substrate 10 supports each of the elements forming the optical module 1, and is equipped with the aperture 11 in which the optical fiber 2 is inserted. The substrate 10 can be made of various materials including conductive materials, such as stainless steel, aluminum, or cupper or nonconductive materials, such as glass, resin, or ceramics. In the present exemplary embodiment, the substrate 10 is made of ceramics, for example.

The optical element 12 is disposed above the aperture 11 and inside an opening 20 provided in the flexible printed circuit board 13, and transmits an optical signal (emits light) toward the optical fiber 2 or receives an optical signal (receives light) emitted from the optical fiber 2 through the flexible printed circuit board 13. If, for example, the optical module 1 is used in an information transmission side, a light emitting element, such as VCSEL (a vertical cavity surface emitting laser), is used as the optical element 12. If the optical module 1 is used in an information reception side, a light receiving element is used as the optical element.

The flexible printed circuit board 13 includes a base member 14 having the opening 20 at a location corresponding to the aperture 11, a first interconnection layer 15 disposed on one surface (the substrate 10 side) of the base member 14, and a second interconnection layer 16 disposed on the other surface of the base member 14, and disposed on one surface (upper surface) of the substrate 10. Further, the flexible printed circuit board 13 includes, as shown in the figure, a connection section 21 that is formed by exposing a part of the first interconnection layer through the opening 20. The first interconnection layer 15 and the optical element 12 are electrically connected in the connection section 21. Such a structure as the connection section 21 is commonly referred to as a "flying lead."

The base member 14 functions as a base of the flexible printed circuit board 13, and is made of a resin film such as a polyimide film or an epoxy film. In view of flexibility and ease of handling, a polyimide film is preferably used.

The first interconnection layer 15 is used for signal transmission between the optical element 12 connected in the connection section 21 and an electronic component, such as a circuit chip, not shown in the figure, and is disposed on one surface of the base member 14. The interconnection layer is formed as a predetermined shape (an interconnection pattern) using a conductive material such as cupper.

The second interconnection layer 16 is used for signal transmission between the optical element 12 and an electronic component, such as a circuit chip not shown in the figure, and is formed on the other surface of the base member 14 as a predetermined shape (an interconnection pattern) using a conductive material, such as cupper.

In order to address or cope with the high-speed operation of the optical element 12, a microstrip line is preferably formed of the base member 14, the first interconnection layer 15, and the second interconnection layer 16. Details thereof are described below.

The underfill member (the alignment member) 17 is interposed between the optical element 12 and an area defined by the aperture 11, and is used to reduce or suppress reflection and dispersion of the optical signal in that position to reduce light loss. Thus, unnecessary reflection is reduced or suppressed to enhance the light coupling efficiency. In the present exemplary embodiment, the underfill member 17 is made of a material having deflection index similar to (more preferably substantially the same as) that of the core of the optical fiber 2 that is inserted in the aperture 11. In view of the manufacturing process, the underfill member 17 is made of a material that can be cured in a process performed after filling with the material, such as epoxy resin having a thermosetting property or photo-curing property.

The sealing member 18 is to protect the optical element 12 and is disposed on the flexible printed circuit board 13 so as to tightly seal the entire optical element 12. In the example shown in the figure, the sealing member 18 is provided so as to cover substantially the entire flexible printed circuit board 13. However, the sealing member is not limited to this form. The sealing member may be partially provided so as to seal at least the optical element 12. The sealing member (potting member) 18 is preferably made of a material that can be cured in a process performed after filling with the material, such as epoxy resin having a thermosetting property or photo-curing property. Further, the sealing member is preferably made of the same material as that of the underfill member 17. Thus, adhesion of the underfill member 17 with the sealing member 18 can be enhanced. In this case, the underfill member 17 and the sealing member 18 can be formed in the same batch.

A process for forming the microstrip line including the base member 14, the first interconnection layer 15, and the second interconnection layer 16 is described herein in detail. The characteristic impedance of the microstrip line formed in such a manner can be set to a desired value based on the following equation. That is, assuming that the width of the transmission line (the first interconnection layer 15) is B, the thickness of the line is C, a distance between the transmission line and the ground (the second interconnection layer used to apply the ground potential) is H, the specific inductive capacity of the dielectric layer (the base member 14) is $\epsilon r$, the characteristic impedance Z0 of the microstrip line is given by the following equation.

$$Z0 = (87/(\epsilon r + 1.41)^{1/2}) \times \ln(5.98H/(0.8B + C))$$

If the input/output impedance of the optical element 12 is 50 Ω, the characteristic impedance of the microstrip line should be set to 50 Ω to make the impedances match with each other, thereby reducing or preventing the signal from decaying. For example, by using a polyimide film having the specific inductive capacity $\epsilon r = 3.4$ as the base member 14, and setting the parameters as follows: B=0.09 mm; H=0.05 mm; and C=0.012 mm, the characteristic impedance Z0 of the microstrip line can be set to approximately 50 Ω. If the thickness of the base member 14 is thinner than 0.05 mm, the width of the conductive line becomes too narrow resulting in increased DC resistance or fluctuation in the impedance value caused by variation of the line width.

The optical module 1 according to the present exemplary embodiment has the structure described above. A method of manufacturing the optical module 1 is described herein.

FIGS. 2a–2g are schematics explaining the manufacturing method of the optical module according to the present exemplary embodiment. In the present exemplary embodiment, a number of optical modules, each identical to the optical module 1, are formed on one parent substrate in a batch, and then the parent substrate is divided into each optical module that is hereinafter also denoted as 1. Details are described bellow.

Firstly, as shown in FIG. 2a, a parent substrate 100 that is a parent material of the substrate 10 of each optical module 1 is provided. Then, the parent substrate 100 is provided with a plurality of apertures 11, each corresponding to respective area where respective one of the optical modules 1 is formed, and the optical fiber 2 is to be inserted in each of apertures 11. In this case, if a ferrule is attached to the optical fiber 2, the apertures 11 are formed with diameter suitable for the diameter of the ferrule.

Then, as shown in FIG. 2b, a pin 101 (a supporting member), as a jig, is inserted in each aperture 11. The pin 101 is used to support the connection section from the reverse side when the optical element 12 is mounted in the later process. The material of the pin 101 is not specified, but certain metals are preferably used. In the present exemplary embodiment, one end surface of the pin 101 and one surface of the parent substrate 100 are polished at the same time to obtain a smooth plane. Alternately, the one end surface (the surface exposed to the one surface of the parent substrate 100) of the pin 101 is made substantially flat, and the pin 101 is then inserted to the parent substrate 100 while aligning the position thereof so that the flat surface of the pin 101 is aligned with the one surface of the parent substrate 100. As shown in the figure, in the present exemplary embodiment, the other end of the pin 101 is protruded from the other surface of the parent substrate 100, and is fixed with resin 102. However, if the fixing strength of the pin 101 is sufficient, for example, in case the pin 101 is press fitted to the aperture 11, the resin 102 is omissible.

Then, as shown in FIG. 2c, each opening 20 of the flexible printed circuit board 13 is aligned with corresponding one of the apertures 11 of the parent substrate 100. Then, as shown in FIG. 2d, the flexible printed circuit board 13 is attached on the parent substrate 100. An epoxy adhesive is used to fix the flexible printed circuit board 13 to the parent substrate 100. In the present exemplary embodiment, the flexible printed circuit board 13 including the microstrip line is used.

Then, as shown in FIG. 2e, each of the plurality of optical elements 12 is disposed on respective one of the openings 20 of the flexible printed circuit board 13, and then connected to the connection section 21. In this case, each of the optical elements 12 is mounted on the connection section 21 with respective light emitting surface facing toward the aperture 11. In the present process, the optical element 12 and the connection section 21 are connected by, for example, flip-chip bonding. In this case, a solder bump necessary for the flip-chip bonding can be formed on either of the optical element 12 side or the connection section 21 side. However, if the solder bump is formed on the connection section 21 side, handling of the optical element 12 (an operation performed by an assembly robot, such as absorption) becomes easier.

In the present process, since the opening 20 of the base member 14 is opened broader than the optical element 12, the optical element 12 is inserted inside of the opening 20. In the present process, since the connection section 21 is supported from lower side by the pin 101, the connection section 21 is prevented from deformed or broken, or such breakage or deformation is reduced when the optical element 12 is mounted, and the optical element 12 can easily and surely be mounted. In the present process, other electronic components (for example, a driver to drive the optical element 12) can be mounted on the flexible printed circuit board 13 if required.

Then, as shown in FIG. 2e, the underfill member 17 to reduce the light loss is filled between the optical element 12 and an area defined by the aperture 11. In the present process, the underfill member made of, for example, transparent epoxy resin is infiltrated between the optical element 12 (in more detail, the light emission surface of the optical element 12) and the aperture 11, and then hot-cured.

Then, as shown in FIG. 2f, the sealing member 18 is formed so that the whole of the optical element 12 is tightly sealed. As the sealing member 18, for example, thermosetting epoxy resin can be used. It is possible to form the sealing member 18 and the underfill member 17 in a batch from the same material, to simplify the manufacturing process. As described above, the sealing member 18 can be partially formed only adjacent area to each of the optical elements 12. The sealing member 18 can preferably be provided on substantially whole area of the one surface side of the parent substrate 100 as in the present exemplary embodiment, to further simplify the manufacturing process.

Then, as shown in FIG. 2g, the parent substrate 100 and other necessary members are divided into a predetermined area corresponding to each of the plurality of optical modules 1. Dicing or laser cutting can be used for the dividing process. Then, after removing the pin 101 and the resin 102, a plurality of optical modules 1 are obtained.

As described above, in the optical module 1 of the present exemplary embodiment, it is not necessary to pattern the interconnection layer on the substrate 10 because the flexible printed circuit board 13 having interconnection layers 15 and 16 is used, thus reducing the production cost and accordingly reducing total cost of the optical modules. Furthermore, since the optical element 12 is disposed on the connection section 21 (so-called "flying lead") exposed through the opening 20 provided on the flexible printed circuit board 13, the distance between the optical fiber 2 and the optical element 12 can be shortened, thus enhancing the light coupling efficiency. Since the light coupling efficiency is enhanced, the alignment margin is advantageously increased.

The optical module 1 according to the present exemplary embodiment can preferably be applied to an optical communication device (an optical transceiver). The optical communication device according to the present invention can be applied to personal computers, PDAs (portable information terminal devices), personal digital assistants, or other various electronic devices, for example.

(Second Exemplary Embodiment)

Figure 3B:
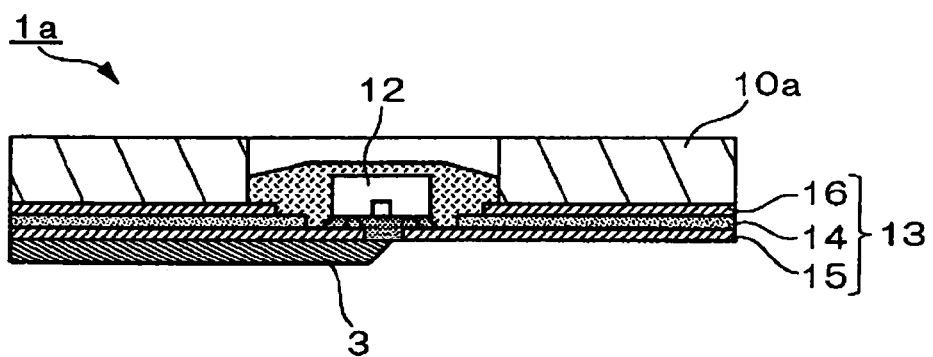

FIGS. 3a and 3b are schematics explaining a structure of an optical module according to a second embodiment. In the figure, a cross-sectional view of the optical module according to the present exemplary embodiment is illustrated. In the optical module 1a shown in the figures, the same reference numerals are used for the components that are common to the optical module 1 according to the first exemplary embodiment. The detailed description for the common components is omitted herein.

The optical module 1a shown in FIG. 3a includes a substrate 10a, the optical element 12, the flexible printed circuit board 13, the underfill member 17, and a sealing member 18a. The optical module 1a, for example, as shown in FIG. 3b, performs transmission or reception of the optical signal to or from the outside through a light guide 3 disposed on the other surface of the flexible printed circuit board 13. Alternatively, the optical module 1a can be used in combination with an optical electronic mixed board equipped with a light guide.

The substrate 10a supports each of the components forming the optical module 1a, and provided with an aperture 11a to define a space in which the optical element 12 is disposed. Although the aperture 11a is a through hole of the substrate 10a in an example shown in the figures, the aperture 11a is not necessarily the through hole and instead can be a hollow. Materials suitable for the substrate 10a are the same as those in the first exemplary embodiment mentioned above. In the present exemplary embodiment, the substrate 10a is made of, for example, ceramics.

The optical element 12 is disposed inside the aperture 11a and inside the opening 20 provided in the flexible printed circuit board 13, and transmits or receives the optical signal through the flexible printed circuit board 13.

The flexible printed circuit board 13 includes a base member 14 having the opening 20 at a location corresponding to the aperture 11a, a first interconnection layer 15 disposed on one surface (the opposite side of the substrate 10) of the base member 14, and a second interconnection layer 16 disposed on the other surface (the substrate 10 side) of the base member 14, and is disposed on one surface (lower surface) of the substrate 10. Further, the flexible printed circuit board 13 includes, as shown in the figure, a connection section 21 that is formed by exposing a part of the first interconnection layer through the opening 20. The first interconnection layer 15 and the optical element 12 are electrically connected in the connection section 21.

The sealing member 18a is to protect the optical element 12 and is disposed inside the aperture 11a and on the flexible printed circuit board 13 so as to tightly seal the whole of the optical element 12.

A manufacturing method of the optical module 1a according to the present exemplary embodiment is described herein. The manufacturing method according to the present exemplary embodiment is basically the same as the manufacturing method according to the first exemplary embodiment. Therefore, the description hereinafter is mainly focused on the differences therebetween.

Figure 4A:
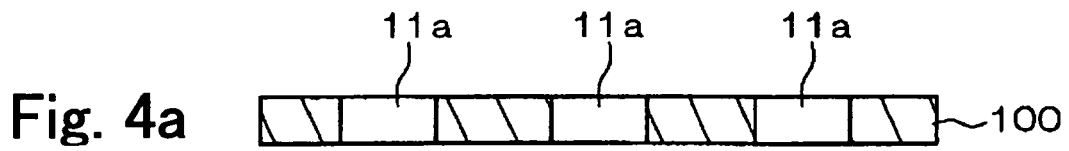
FIGS. 4a–4f are schematics explaining a manufacturing method of an optical module according to a second exemplary embodiment.

FIGS. 4a–4f are schematics explaining the manufacturing method of the optical module according to the second exemplary embodiment. Firstly, as shown in FIG. 4a, a parent substrate 100 that is a parent material of the substrate 10 of each optical module 1 is provided. Then the parent substrate 100 is provided with a plurality of apertures 11a, each corresponding to respective area where respective one of the optical modules 1 is formed.

Figure 4B:
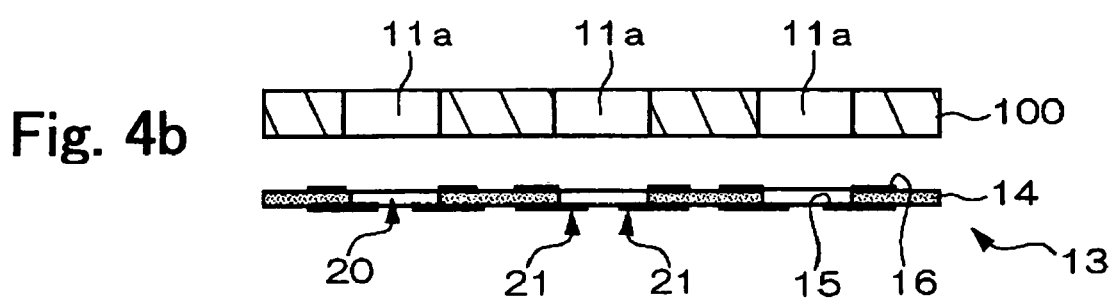
Figure 4C:
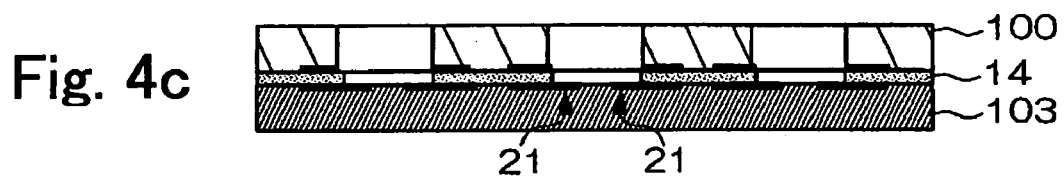

Then, as shown in FIG. 4b, the each opening 20 of the flexible printed circuit board 13 is aligned with corresponding one of the apertures 11a of the parent substrate 100. Then, as shown in FIG. 4c, the flexible printed circuit board 13 is attached on the parent substrate 100. In the present exemplary embodiment, the flexible printed circuit board 13 including the microstrip line is used.

Further, as shown in FIG. 4c, a dummy substrate 103 is disposed as a jig on the other surface (the opposite side of the parent substrate 100) of the flexible printed circuit board 13. The dummy substrate 103 has at least one substantially flat surface, and is used to support the flexible printed circuit board 13 from behind when the optical element 12 is mounted in the subsequent process. Materials of the dummy substrate 103 are not limited, but metals or glass, for example, are preferably used. In the present exemplary embodiment, SUS (stainless steel) substrate is used as the dummy substrate 103. Further, the dummy substrate 103 is more preferably fixed to the parent substrate 100 by screw cramping, etc. In the present process, the dummy substrate 103 can be omitted providing at least the connection section 21 is supported by a flat surface. However, by using the dummy substrate 103, the optical element 12 can easily be mounted.

Figure 4D:
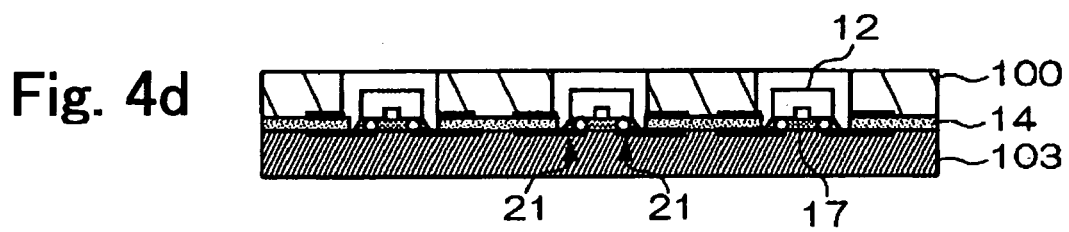

Then, as shown in FIG. 4d, each of the plurality of optical elements 12 is disposed on respective one of the openings 20 of the flexible printed circuit board 13, and then connected to the connection section 21. Then, the underfill member 17 to reduce the light loss is filled between the optical element 12 and the connection section 21. In this case, each of the optical elements 12 is mounted on the connection section 21 with the light emitting surface thereof facing toward outside of the substrate 10a. In the present process, the optical element 12 is connected with the connection section 21 of the first interconnection layer 15 by flip-chip bonding.

In the present process, since the opening 20 of the base member 14 is opened broader than the optical element 12, the optical element 12 is inserted inside of the opening 20. In the present process, since the connection section 21 is supported from lower side by the dummy substrate 103, the connection section 21 is prevented from deformed or broken, or such breakage or deformation is reduced, when the optical element 12 is mounted, and the optical element 12 can easily and surely be mounted. In the present process, other electronic components (for example, a driver to drive the optical element 12) can be mounted on the flexible printed circuit board 13 if required.

Figure 4E:
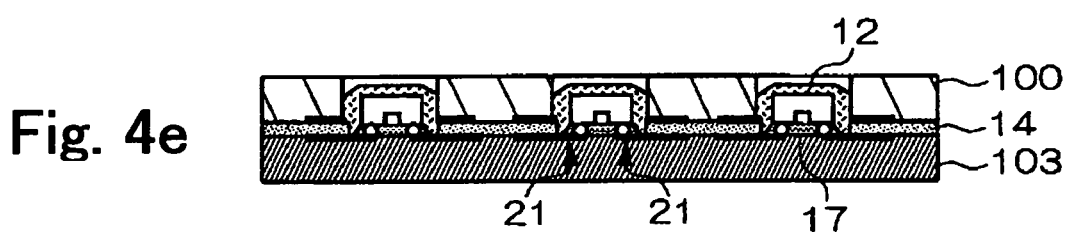

Then, as shown in FIG. 4e, the sealing member 18a is formed so that the whole of the optical element 12 is tightly sealed. As the sealing member 18a, for example, thermosetting epoxy resin can be used. It is possible to form the sealing member 18a and the underfill member 17 in a batch from the same material.

Figure 4F:
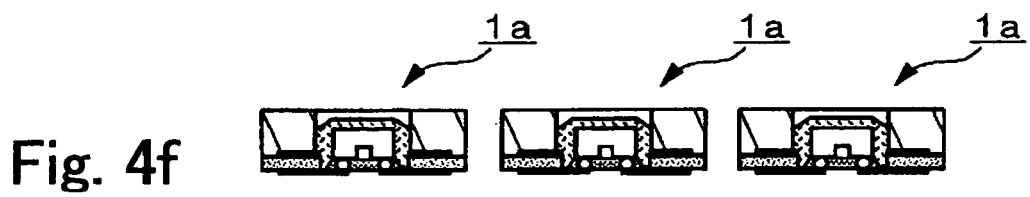

Then, as shown in FIG. 4f, after removing the dummy substrate 103, the parent substrate 100 and other necessary members are divided into a predetermined area corresponding to each of the plurality of optical modules 1a. Dicing or laser cutting can be used for the dividing process. Thus, a plurality of optical modules 1a can be obtained.

As described above, the optical module 1a according to the second exemplary embodiment, in the same manner as the first exemplary embodiment, is able to reduce the total cost of the optical module by reducing the manufacturing cost, and also to enhance the light coupling efficiency by reducing the distance between the optical fiber and the optical element. Furthermore, the optical element 12 is disposed in the space defined by the aperture 11a to dispose elements. Also, the optical element 12 is supported by the flexible printed circuit board 13 disposed so as to cover the aperture 11a. By adopting such a structure, further downsizing of the optical module 1a is possible. The optical module 1a according to the present exemplary embodiment can also be applied to an optical transceiver or various electronic devices as well, for example.

(Third Exemplary Embodiment)

Figure 5:
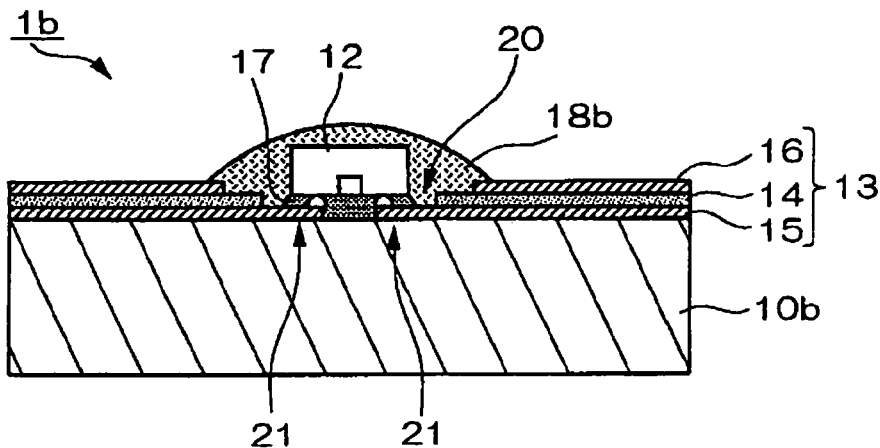
FIG. 5 is a schematic explaining a structure of an optical module according to a third exemplary embodiment.

FIG. 5 is a schematic explaining a structure of an optical module according to the third exemplary embodiment. In the figure, a cross-sectional view of the optical module according to the present exemplary embodiment is illustrated. In the optical module 1b shown in the figure, the same reference numerals are used for the components that are common to the optical module 1 according to the first exemplary embodiment. The detailed description for the common components is omitted herein.

The optical module 1b shown in the figure is equipped with basically the same components as the optical module 1 according to the first exemplary embodiment as described above. The major difference is that the aperture 11 in which the optical fiber 2 is inserted is omitted. More specifically the optical module 1b includes a transparent substrate 10b, the flexible printed circuit board 13, the underfill member 17, and a sealing member 18b. This optical module 1b is equipped with optical components, such as a lens or a mirror on the other surface side of the transparent substrate 10b. Further, a light guide to transmit or receive an optical signal to or from the optical element is also equipped, or the optical module 1b is used in combination with the optical electronic mixed board equipped with such a light guide. Further, a sleeve to support the optical fiber can be provided on the other side of the substrate 10b, and further a lens can be provided at either the other side of the substrate 10b or the sleeve side.

The substrate 10b supports each of the components forming the optical module 1b, and is made of a material having translucency. This substrate 10b needs to have high transmission factor only in a wavelength range of the target optical signal, and a glass substrate, a plastic substrate or the like can be used.

The optical element 12 is disposed inside the opening 20 provided in the flexible printed circuit board 13, and transmits the optical signal (emits light) to the outside or receives the optical signal (receives light) from the outside through the flexible printed circuit board 13 and the substrate 10b. In further detail, the optical element 12 is connected to the connection section 21 provided by exposing a part of the first interconnection layer 15 through the opening 20.

The sealing member 18b is to protect the optical element 12 and is disposed on the flexible printed circuit board 13 so as to tightly seal the entire optical element 12. The sealing member 18b is formed to cover substantially the whole of the one surface of the substrate 10b similarly to the first exemplary embodiment.

A manufacturing method of the optical module 1b according to the present exemplary embodiment is described. The manufacturing method according to the present exemplary embodiment is basically the same as the manufacturing method according to the first exemplary embodiment. Therefore, the description hereinafter is mainly focused on the differences therebetween.

Figure 6A:
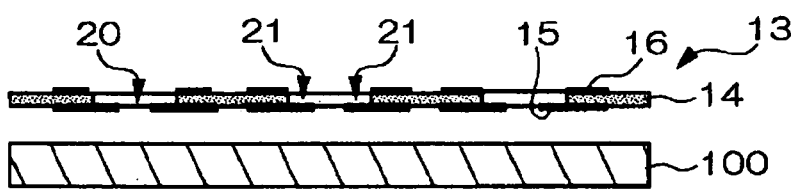
FIGS. 6a–6e are schematics explaining a manufacturing method of an optical module according to a third exemplary embodiment.
Figure 6B:

FIGS. 6a–6e are schematics explaining a manufacturing method of the optical module according to the third exemplary embodiment. Firstly, as shown in FIG. 6a, a parent substrate 100 that is a parent material of the substrate 10 of each optical module 1 and the flexible printed circuit board 13 are provided. Then, as shown in FIG. 6b, the flexible printed circuit board 13 is attached on the parent substrate 100. In the present exemplary embodiment, the flexible printed circuit board 13 including the microstrip line is used.

Figure 6C:
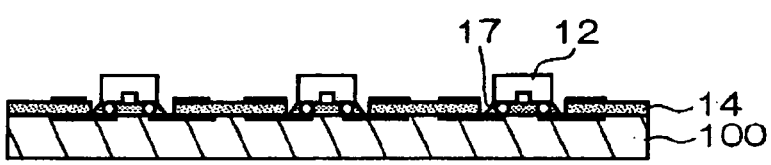

Then, as shown in FIG. 6c, each of the plurality of optical elements 12 is disposed on respective one of the openings 20 of the flexible printed circuit board 13, and then connected to the connection section 21. Then, the underfill member 17 for reducing the light loss is filled between the optical element 12 and the connection section 21. In this case, each of the optical elements 12 is mounted on the connection section 21 with the light emitting surface thereof facing toward the substrate 10b. In the present process, the optical element 12 is connected with the connection section 21 of the first interconnection layer 15 by flip-chip bonding. In the present process, since the opening 20 of the base member 14 is opened broader than the optical element 12, the optical element 12 is inserted inside of the opening 20. In the present process, other electronic components (for example, a driver to drive the optical element 12) can be mounted on the flexible printed circuit board 13 if required.

Figure 6D:
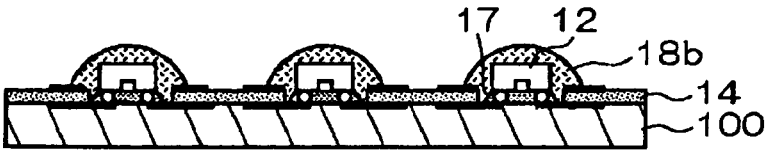
Figure 6E:
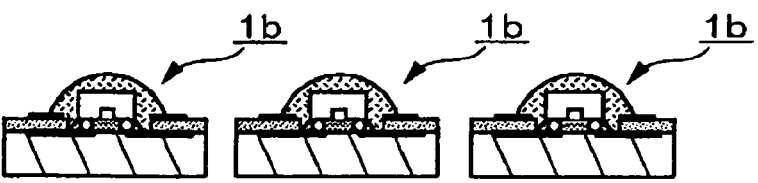

Then, as shown in FIG. 6d, the sealing member 18b is formed so that the whole of the optical element 12 is tightly sealed. As the sealing member 18b, for example, thermosetting epoxy resin can be used. It is possible to form the sealing member 18b and the underfill member 17 in a batch from the same material.

Then, as shown in FIG. 6f, the parent substrate 100 and other necessary members are divided into a predetermined area corresponding to each of the plurality of optical modules 1b. Dicing or laser cutting can be used for the dividing process. Thus, a plurality of optical modules 1b can be obtained.

As described above, the optical module 1b according to the third exemplary embodiment, in the same manner as the first exemplary embodiment, is able to reduce the total cost of the optical module by reducing the manufacturing cost. It is possible to enhance the light coupling efficiency by reducing the distance between the optical fiber and the optical element as much as the thickness of the base member 14. The optical module 1b according to the present exemplary embodiment can also be applied to an optical transceiver or various electronic devices as well, for example.

The various exemplary embodiments of the optical module according to the present invention are described hereinabove, but the scope of the present invention is not limited within the contents of the above exemplary embodiments, and various modifications are possible within the scope or spirit of the present invention.

Figure 7:
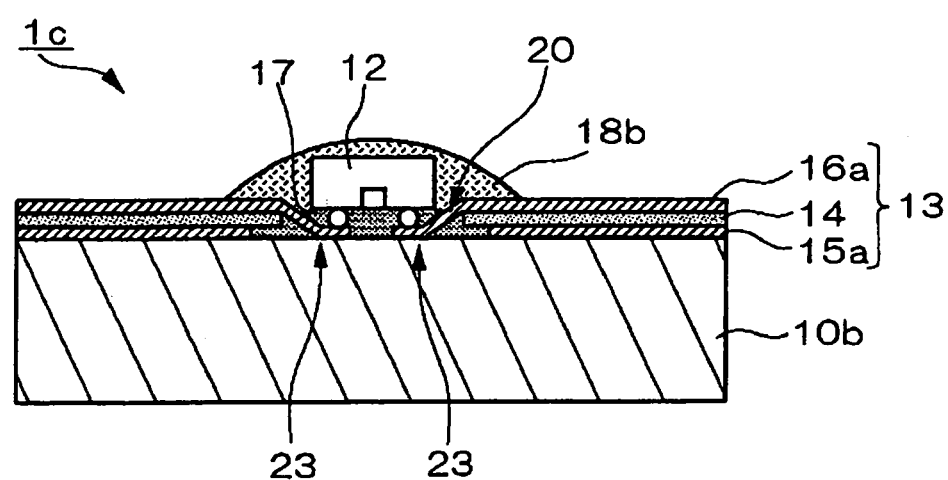
FIG. 7 is a schematic explaining another structure of an optical module.

FIG. 7 is a schematic explaining another exemplary configuration of an optical module. The optical module 1c shown in the figure is formed by changing the layout of the connection section of the optical module 1b according to the third exemplary embodiment as described above. More specifically, in the optical module 1c shown in FIG. 7, the connection section 23 is formed by exposing through the opening 20 a part of the second interconnection layer 16 disposed on the other side of the flexible printed circuit board 13, the other side not contacting with the substrate 10b. The optical element 12 is connected to the connection section 23. In the first and second embodiments, the similar or the same structure can be adopted.

Further, as the optical element in each exemplary embodiment, multiple light source devices (such as a VCSEL array) or multiple light sensor devices (such as a photodiode array) can be used, and a multi-channel (multi-core) tape fiber or the like can be used as the optical fiber, thus realizing the optical module suitable for a parallel transfer application.

What is claimed is:

1. An optical module to detachably connect to an optical fiber, the optical module comprising:
   a substrate with an aperture in which the optical fiber is inserted;
   a flexible printed circuit board disposed on one surface of the substrate, the flexible printed circuit board including:
   a base member with an opening in a corresponding location to the aperture;
   an interconnection layer disposed on at least one surface of the base member; and
   a connection section including a part of the interconnection layer exposed through the opening; and
   an optical element disposed within the opening of the flexible printed circuit board and connected to the connection section, the optical element performing one of transmission and reception of an optical signal with the optical fiber.

2. The optical module according to claim 1, further comprising an alignment member interposed between an area defined by the aperture and the optical element, the alignment member suppressing dispersion of the optical signal.

3. The optical module according to claim 1, further comprising a seal member to tightly seal the optical element.

4. The optical module according to claim 3, the seal member and the alignment member being made of the same material.

5. The optical module according to claim 1, the flexible printed circuit board including a microstrip line.

6. An optical communication device, comprising:
   the optical module according to claim 1.

7. An electronic device, comprising:
   the optical module according to claim 1.

8. An optical module for use with a component, the optical module comprising:
   a substrate with an aperture in which the component is disposed;
   a flexible printed circuit board disposed on one surface of the substrate, the flexible printed circuit board including:
   a base member with an opening in a corresponding location to the aperture;
   an interconnection layer disposed on at least one surface of the base member; and
   a connection section including a part of the interconnection layer exposed through the opening; and
   an optical element disposed inside the aperture and within the opening of the flexible printed circuit board and connected to the connection section, the optical element performing one of transmission and reception of an optical signal through the flexible printed circuit board.

9. An optical module, comprising:
   a substrate having translucency;
   a flexible printed circuit board disposed on one surface of the substrate, the optical module including:
   a base member with an opening;
   an interconnection layer disposed on at least one surface of the base member; and a connection section including a part of the interconnection layer exposed through the opening; and an optical element disposed within the opening of the flexible printed circuit board and connected to the connection section, the optical element performing one of transmission and reception of an optical signal through the flexible printed circuit board and the substrate.

10. A method of manufacturing an optical module to detachably connect to an optical fiber, the method comprising:

boring an aperture in a substrate in which the optical fiber is inserted;

mounting a flexible printed circuit board on one side of the substrate, the flexible printed circuit board including a base member with an opening, an interconnection layer disposed on at least one surface of the base member, and a connection section including a part of the interconnection layer exposed through the opening, so that the opening corresponds to the aperture; and disposing an optical element in the opening of the flexible printed circuit board to be connected to the connection section, the optical element performing one of transmission and reception of an optical signal with the optical fiber.

11. The method according to claim 10, further comprising forming an alignment member between an area defined by the aperture and the optical element, the alignment member suppressing dispersion of the optical signal.

12. The method according to claim 10, further comprising forming a sealing member so that the sealing member covers the optical element.

13. A method of manufacturing an optical module to detachably connect to an optical fiber, the method comprising:

boring a plurality of apertures in a substrate, the optical fiber being inserted in each of the apertures;

mounting a flexible printed circuit board on one side of the substrate, the flexible printed circuit board including a base member with a plurality of openings, an interconnection layer disposed on at least one surface of the base member, and connection sections each including a part of the interconnection layer exposed through one of the openings, so that each of the openings corresponds to a respective one of the apertures;

disposing an optical element in each of the openings of the flexible printed circuit board to be connected to one of the connection sections, the optical element performing one of transmission and reception of an optical signal with the optical fiber; and dividing the substrate into predetermined areas, each corresponding to a respective one of the apertures.

14. A method of manufacturing an optical module, comprising:

boring an aperture in a substrate in which a component is disposed;

mounting a flexible printed circuit board on one side of the substrate, the flexible printed circuit board including a base member with an opening, an interconnection layer disposed on at least one surface of the base member, and a connection section including a part of the interconnection layer exposed through the opening, so that the opening corresponds to the aperture; and disposing an optical element inside the aperture and in the opening of the flexible printed circuit board to be connected to the connection section thereof so that one of a light emission surface and a light reception surface thereof faces the flexible printed circuit board, the optical element performing one of transmission and reception of an optical signal.

15. A method of manufacturing an optical module, comprising:

providing a substrate having translucency;

mounting a flexible printed circuit board on one side of the substrate, the flexible printed circuit board including a base member with an opening, an interconnection layer disposed on at least one surface of the base member, and a connection section including a part of the interconnection layer exposed through the opening; and disposing an optical element in the opening of the flexible printed circuit board to be connected to the connection section thereof so that one of a light emission surface and a light reception surface thereof faces the flexible printed circuit board, the optical element performing one of transmission and reception of an optical signal.

* * * * *